United States Patent [19]

Imamura

[11] 4,103,187
[45] Jul. 25, 1978

[54] POWER-ON RESET SEMICONDUCTOR INTEGRATED CIRCUIT

[75] Inventor: Yoichi Imamura, Suwa, Japan

[73] Assignee: Kabushiki Kaisha Suwa Seikosha, Japan

[21] Appl. No.: 724,496

[22] Filed: Sep. 20, 1976

[30] Foreign Application Priority Data

Sep. 19, 1975 [JP] Japan .................................. 50-113269

[51] Int. Cl.² .................... H03K 17/22; H03K 17/20; H03K 17/60; H03K 21/32
[52] U.S. Cl. ................................... 307/251; 58/23 A; 58/23 BA; 307/200 B; 307/247 A; 307/279; 307/296 R; 328/48
[58] Field of Search .................... 307/208, 200 B, 246, 307/247 A, 251, 205, 279, 288, 296; 328/60, 48; 58/23 A, 23 BA, 23 AC, 23 D, 50 R

[56] References Cited

U.S. PATENT DOCUMENTS

| | | | |
|---|---|---|---|
| 3,765,163 | 10/1973 | Levine et al. | 58/23 A X |
| 3,823,551 | 7/1974 | Riehl | 58/23 BA X |
| 3,828,278 | 8/1974 | Rees | 58/23 A X |
| 3,882,329 | 5/1975 | Tyau | 307/215 |
| 3,894,247 | 7/1975 | Jong | 307/208 |
| 3,895,239 | 7/1975 | Alaspa | 307/296 X |
| 3,949,545 | 4/1976 | Chihara | 58/23 BA |
| 3,950,654 | 4/1976 | Broedner et al. | 307/208 |
| 3,979,608 | 9/1976 | Sekiya et al. | 307/296 X |
| 4,001,609 | 1/1977 | Sickert | 307/296 R X |
| 4,004,163 | 1/1977 | Spence | 307/246 X |

OTHER PUBLICATIONS

Lohman, "Applications of MOSFETs in Microelectronics"; SCP and Solid-State Technology; pp. 23-29, 3/1966.
Hanchett, "Turn-On Reset Pulse Circuits"; RCA Technical Notes; TN No. 927; 4 pp. 3/28/73.
Suzuki, et al., "Clocked CMOS Calculator Circuitry"; 1973 IEEE Int'l Solid-State Circuits Conference; 2/14/73, pp. 58-59, (Digest of Technical Papers).

Primary Examiner—Larry N. Anagnos
Attorney, Agent, or Firm—Blum, Moscovitz, Friedman & Kaplan

[57] ABSTRACT

A semiconductor integrated power-on reset circuit that is formed on the same monolithic substrate as the circuitry that same is adapted to reset in order to obtain higher component density on the monolithic substrate is provided. The circuitry on the monolithic substrate defines a predetermined parasitic capacitance and includes a voltage supply for selectively applying a supply voltage to the circuitry to operate the circuitry at the supply voltage after a first predetermined interval of time. The power-on reset circuit is disposed intermediate the voltage supply and the circuitry and includes at least one pair of complementary coupled P-channel and N-channel MOS transistors, coupled to define an output terminal having the predetermined parasitic capacitance thereat. The output terminal of the reset circuit is coupled to the circuitry and applies a reset signal to the circuitry after the circuitry is energized to the supply voltage in response to the supply voltage being selectively applied to the reset circuit.

14 Claims, 7 Drawing Figures

POWER-ON RESET SEMICONDUCTOR INTEGRATED CIRCUIT

BACKGROUND OF THE INVENTION

This invention is directed to a semiconductor integrated power-on reset circuit and in particular to a semiconductor integrated power-on reset circuit that is formed on the same monolithic substrate as the digital circuitry same is adapted to reset to a predetermined binary state in order to realize higher component density and the elimination of discrete circuit components required for use with the monolithic substrate.

Heretofore, digital electronic instrumentation, such as electronic timepieces, calculators and the like that are formed on a single monolithic substrate having complementary coupled P-channel and N-channel MOS field effect transistors, hereinafter referred to as "C-MOS transistors" have not been provided with a reset circuit that automatically references the digital circuitry to a predetermined binary state at the time that the power applied to the digital circuitry is turned on. One reason is that power-on reset circuits of the type known in the prior art would reduce the component density on the monolithic substrate or alternatively would require additional discrete circuit elements to be coupled to the substrate.

Moreover, the absence of such power-on reset circuits lessens the reliability of such digital circuitry. For example, in electronic digital timepieces, if a power-on reset circuit is not provided, a considerable period of time is required to determine if the timepiece had been accurately set to a predetermined binary state when the power is turned on. Similarly, in an electronic calculator, the absence of a power-on reset circuit prevents the respective registers and counters thereof from being set to a predetermined zero state when the power source of the calculator is turned on. Accordingly, a power-on reset circuit that is formed on the same circuit chip as the circuitry that same is adapted to reset, that realizes higher component density on the circuit chip and that eliminates the additional discrete circuit components required for use with the circuit chip is desired.

SUMMARY OF THE INVENTION

Generally speaking, in accordance with the instant invention, a semiconductor integrated power-on reset circuit formed on the same circuit chip as the digital circuitry that same is adapted to reset is provided. The digital circuitry is formed of C-MOS transistors constructed and arranged on a substrate to define a predetermined parasitic capacitance. A voltage supply is adapted to selectively apply to the digital circuitry a supply voltage for operating the digital circuitry at a predetermined interval of time after the supply voltage is initially applied to the digital circuitry. Reset circuitry is disposed intermediate the voltage supply and the digital circuitry, the reset circuitry being comprised of at least one pair of C-MOS transistors coupled to define an output terminal having the predetermined parasitic capacitance thereat. The output terminal is coupled to the digital circuitry in order to apply a reset signal to the digital circuitry after the digital circuitry is energized to the supply voltage at which same operates in response to the supply voltage being initially applied to the reset circuitry.

Accordingly, it is an object of the instant invention to provide an improved semiconductor integrated power-on reset circuit.

A further object of the instant invention is to provide an improved semiconductor integrated power-on reset circuit formed of MOS transistors on the same substrate as the digital circuitry same is utilized to reset.

Still another object of the instant invention is to provide a power-on reset circuit that utilizes the parasitic capacitance of a semiconductor integrated circuit chip in order to realize higher component density and eliminate the coupling of discrete circuit components to the integrated circuit chip.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
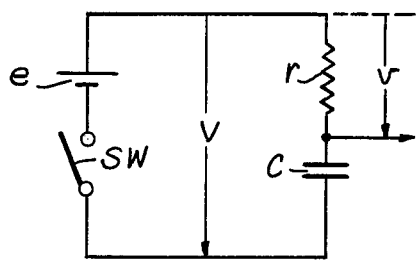
FIG. 1 is an RC power-on reset circuit constructed in accordance with the prior art.
Figure 2:
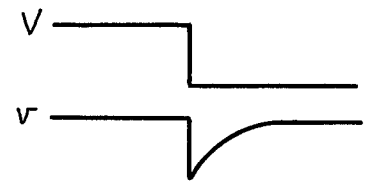
FIG. 2 is a wave diagram illustrating the operation of the power-on reset circuit depicted in FIG. 1.

Reference is now made to FIGS. 1 and 2, wherein an RC power-on reset circuit constructed in accordance with the prior art, and the manner in which same operates are respectively depicted. In order to predetermine the initial binary state of a digital circuit when the power utilized to energize same is turned on, it is necessary to apply a reset signal to the digital circuitry at the time that the power utilized to energize same is turned on. As utilized herein, the term "reset" is utilized to generically define the application of a signal to the digital circuitry to set same to a predetermined initial state and includes the application of "set to ONE", "reset to ZERO" or any other like binary control function. Accordingly, as is depicted in FIG. 1, an RC series circuit comprised of a resistor r defining an output terminal and a capacitor C is disposed intermediate the voltage supply e and a digital circuit to be energized. The function of the power-on reset circuit, hereinafter referred to as a "POR circuit", is to delay the application of a reset pulse to the digital circuitry until after all of the circuitry is energized to the supply voltage at which same is to be operated.

Specifically, when a manually operated switch SW is closed, the voltage supply e produces a supply voltage V to the RC circuit. Accordingly, the capacitor C is initially charged by the supply voltage and is discharged in accordance with the RC constant defined by the resistor r and the capacitor C until the capacitor is fully charged, after which the output voltage across the resistor r returns to the supply voltage level. As is explained in greater detail below, the RC time constant is selected so that the reset level is delayed until the transient response of all of the circuit elements being energized by the power supply, when the power supply is turned on, disappears, whereafter, the reset level is returned in order to generate a reset signal. Thus, the capacitor in the RC circuit is utilized to quickly change the voltage level across resistor r at power on, whereafter the RC series circuit is utilized to return the output voltage to the predetermined operating level and provide a sufficient change in the voltage level to effect resetting after each of the digital circuit elements have been energized to the voltage at which same are to be operated and thereby assure that the digital circuitry is reset to an initial predetermined binary state at power-on.

Figure 3:
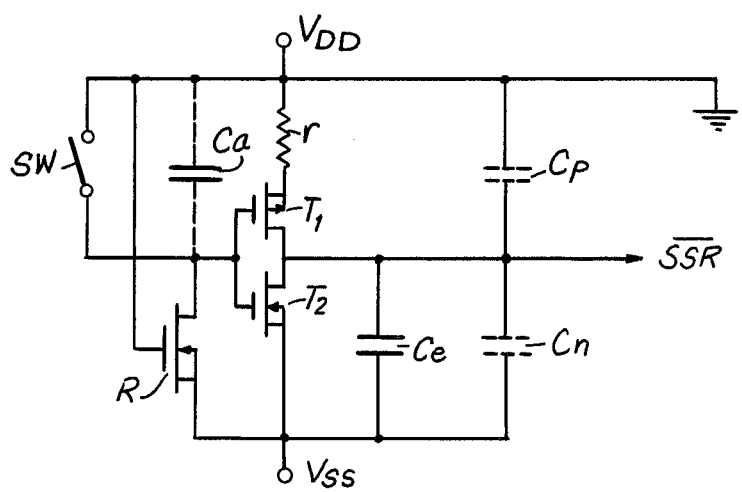
FIG. 3 is a circuit diagram of a semiconductor integrated power-on reset circuit constructed in accordance with a preferred embodiment of the instant invention.
Figure 5:
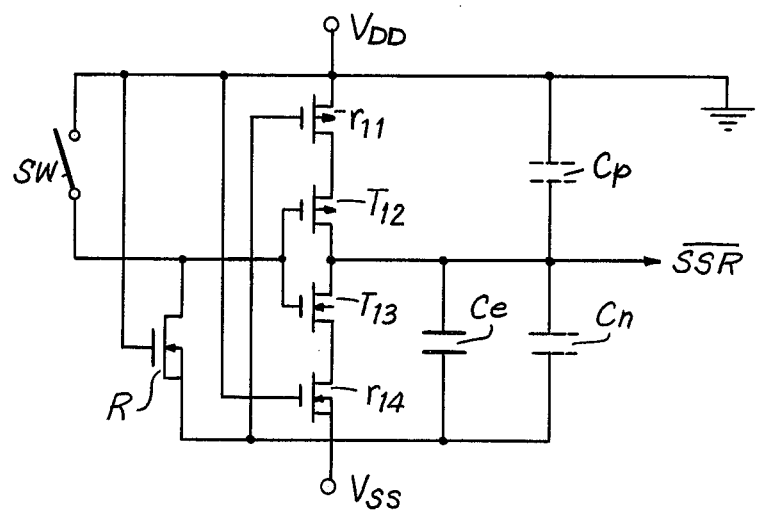
FIG. 5 is a circuit diagram of a semiconductor integrated power-on reset circuit constructed in accordance with still another preferred embodiment of the instant invention.

It is noted that the POR circuit embodiments depicted in FIGS. 3 and 5 of the instant invention utilize the RC series circuit concept. Nevertheless, when forming a POR circuit on a semiconductor integrated circuit chip, it becomes more difficult to reset the circuitry once the circuitry is fully energized at power-on in view of the chatter caused by the resistor R of the RC series circuit and the parasitic capacitance of the circuit chip. For example, when the change in the supply voltage e and change in the output voltage v for the circuit depicted in FIG. 1 is respectively as follows:

$$e = -\{1 - \exp(-t/\tau)\}(E_o > 0) \quad (1)$$

$$v = \frac{rc}{rc - \tau} E_o \{\exp(-\frac{t}{\tau}) - \exp(-\frac{t}{rc})\} \quad (2)$$

The following expression must be satisfied in order to obtain a sufficient reset pulse width and level of the reset pulse:

$$\tau < rc \quad (3)$$

When the POR circuit is monolithically integrated onto a single circuit chip, the parasitic capacitance ($C_p$, $C_n$) is parasitic on the side of both poles of the power source. Thus, in C-MOS circuits formed on the same circuit chip, the following condition must always be satisfied if the POR circuit is to produce a reset pulse after each of the circuits has been energized to the operating voltage:

$$C_p << (C_e + C_n) \quad (4)$$

As is illustrated below, it is necessary to reduce the P-channel capacitance with respect to the parasitic capacitance of the N-channel transistor ($C_n$) and any additional capacitance that is provided in order to assure that the parasitic capacitance not utilized in the RC series circuit is quickly charged and thereby forms an open circuit. The capacitor $C_e$ is a capacitance other than the parasitic capacitance of the inverter transistors and can be monolithically integrated when the integrated circuit chip is formed, either by way of a discrete capacitor or the parasitic capacitance produced by cross-over of electrodes in the chip. Moreover, by way of example, it is noted that a total capacitance on the order of, and not exceeding, about 10 pF of ($C_e + C_n$) is sufficient to effect proper operation of the POR circuit. Additionally, the total capacitance ($C_e + C_n$) of the RC circuit should be selected to be considerably larger than the resistance in order to minimize noise-resistance. Specifically, in an RC series circuit, the greater the magnitude of the resistance, the greater the noise. Accordingly, if a large RC time constant ($\tau$) is provided, by minimizing R and maximizing C, the amount of noise produced by the circuit is sharply reduced.

Accordingly, the instant invention achieves the aforementioned relationship between the capacitance and resistance by utilizing the parasitic capacitance of the semiconductor integrated circuit chip as the C in the RC time constant. This is possible because of the parasitic capacitances of a MOS integrated circuit chip, as the junction capacitance per unit area is greatest after the gate capacitance. Moreover, the N-channel source-drain parasitic junction capacitance is twice as large as that of the drain-source parasitic junction capacitance of the P-channel. Accordingly, N-type transistors can be used where possible and further, the parasitic capacitance produced by the cross-over of the wiring of the reset circuit integrated in the chip may further be used to provide $C_e$. Thus, for example, in a digital display electronic timepiece, if each of the series-connected counters to be reset by a POR circuit constructed in accordance with the instant invention is formed of C-MOS integrated circuits, the length of the integrated wiring and the number of cross unders of the system, and therefore the parasitic capacitance, increases in proportion to the size of the integrated circuit. Thus, the larger size of the integrated circuit, the greater the increase in parasitic capacitance, which increase in parasitic capacitance is utilized to advantage in the instant invention.

Referring specifically to FIG. 3, a POR circuit adapted to utilize the parasitic capacitance resulting from the manner in which the MOS transistors are formed on a monolithic substrate is provided. A P-channel transistor $T_1$ is complementary coupled to an N-channel transistor $T_2$ to define a C-MOS transistor inverter. The respective gate electrodes are coupled together to define an input terminal for receiving the supply voltage $V_{SS}$ through the source-drain connection of a pull-down MOS transistor R. The source terminal of the P-channel transistor $T_1$ is coupled through resistor r to the reference voltage $V_{DD}$. The commonly coupled drain and output terminals of the transistors $T_1$ and $T_2$ are coupled to the supply voltage $V_{SS}$ through capacitors $C_e$ and $C_n$. Additionally, the drain output terminal of the C-MOS transistor is coupled to the reference voltage through the parasitic capacitance $C_p$ defined by the source-drain capacitances of the P-channel transistor formed on the monolithic substrate. The parasitic capacitances $C_p$ and $C_n$, illustrated in dashed lines, represent the parasitic capacitances of the transistors depicted in FIG. 3. It is noted that the capacitor $C_e$ can be integrated into the monolithic substrate when same is formed if an insufficient parasitic capacitance is provided by the integrated circuit to meet equation (4) detailed above, it being noted that a discrete capacitor $C_e$ is clearly not needed when the parasitic capacitance is sufficient to meet such equation.

It is further noted that the resistor $r$ can be formed in the integrated circuit chip in series with the channel resistance of the P-channel transistor $T_1$. Nevertheless, if such is the case, the P-channel transistor can be formed smaller than the N-channel transistor in order to compensate for the increased resistance provided by the resistor $r$ and to maintain the C-MOS transistor inverter in balance. It is noted that the pull-down MOS transistor R is provided for reducing the gate potentials of transistors $T_1$ and $T_2$ with respect to the supply voltage $V_{SS}$. The switch SW is for manually resetting the system in a manner to be discussed more fully below.

Figure 4:
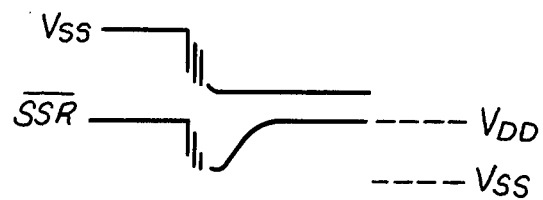
FIG. 4 is a wave diagram illustrating the operation of the power-on reset circuit depicted in FIG. 3.

As is illustrated in FIG. 4, the operation of the semiconductor integrated POR circuit is based on an RC series circuit principal of the type utilized in the POR circuit depicted in FIG. 1. Specifically, when the power supply $V_{SS}$ is initially turned on, the P-channel transistor $T_1$ is turned ON and the N-channel transistor $T_2$ is turned OFF to thereby define an RC series circuit including the resistor $r$, the source-drain resistance of the transistor $T_1$, when same is turned ON, and the total capacitance defined by the parasitic capacitance $C_n$ and $C_e$. From the above formula it is seen that $C_p$ is very small when compared with $C_n + C_e$ in order to insure that same is quickly charged and hence provides an open circuit when the power on condition occurs. Accordingly, by utilizing the parasitic capacitance $C_n$ and the resistor $r$, the level of the output signal $\overline{SSR}$ defines a reset pulse by being returned from a supply voltage level $V_{SS}$ to a reference level $V_{DD}$ at a predetermined interval of time after each of the circuit elements has been energized to a reference voltage when the power is turned on. Thus, as is illustrated in FIG. 4, the operating wave forms of the POR circuit depicted in FIG. 3 are similar to the operating wave forms depicted in FIG. 2 except that the considerable chatter is generated at the time that the power is initially turned on.

Reference is now made to FIG. 5, wherein a semiconductor integrated POR circuit constructed in accordance with a further embodiment of the instant invention for reducing chatter is depicted, like reference numerals being utilized to denote like elements discussed above. A MOS transistor $r_{11}$ replaces the resistor $r$ and defines the RC series network resistance between the transistor $T_{12}$ and the reference voltage $V_{DD}$. Additionally, a further MOS transistor $r_{14}$ is coupled between the voltage supply $V_{SS}$ and the source electrode of the N-channel transistor $T_{13}$. The MOS transistor $r_{11}$ in addition to functioning as a resistance element, further functions to increase the RC time constant $r_{11}(C_e + C_n)$. Moreover, the effective pulse width of the power-on reset signal $\overline{SSR}$ is increased since the transistor $r_{11}$ has a larger resistance when the magnitude of the supply voltage $V_{SS}$ is small and has a smaller resistance when the magnitude of the supply voltage $V_{SS}$ is large. Accordingly, the RC time constant defined by the transistor $r_{11}$, transistor $T_{12}$ and parasitic capacitance $(C_e + C_n)$ reduces the sharpness of the fall of the voltage $V_{SS}$ at the time that the power is turned on, so that the transients and chatter occurring in the circuit elements, in the first instant after the power is turned on, are completely eliminated by the time that the reset pulse is applied to the digital circuitry. Accordingly, by utilizing an MOS resistance, the RC configuration of the circuits depicted in FIGS. 4 and 5 is optimized.

It is further noted that the instant invention is particularly effective when utilized with a digital device wherein the entire device is driven by a single main power supply. For example, in a quartz crystal vibrator electronic wristwatch having a liquid crystal digital display, wherein the booster circuit is driven by an output pulse signal produced by an oscillator circuit, which oscillator circuit is driven by the main power source, in what is commonly known as a Cockcroft Walton connection, as long as the threshold voltage of the MOS resistor $r_{11}$ is higher than the magnitude of the main supply voltage, a highly reliable POR reset circuit is provided. In order to take advantage of this POR circuit in an electronic timepiece, it is necessary to have the POR circuit driven by the booster circuit since the time that is required to power on the oscillator circuit and start same oscillating and the time required to effect operation of the boosting circuit to produce an elevated voltage sufficient to turn the MOS resistance $r_{11}$ ON is considerably longer than the operational speed of the MOS transistors. Accordingly, by having the booster circuit drive the POR circuit, it is assured that the reset pulse produced by the POR circuit will not be produced until after each of the circuits in the electronic timepiece, including the oscillator circuit and booster circuit, are fully energized to their operating voltages.

Finally, it is noted that the MOS resistance $r_{14}$ is provided for balancing the inverter and for improving the noise-resistance. This eliminates the optimum design feature suggested for the embodiment depicted in FIG. 3 that the P-channel transistor be made smaller than the N-channel transistor in order to balance the C-MOS inverter circuit utilized in the POR circuit.

Figure 6:
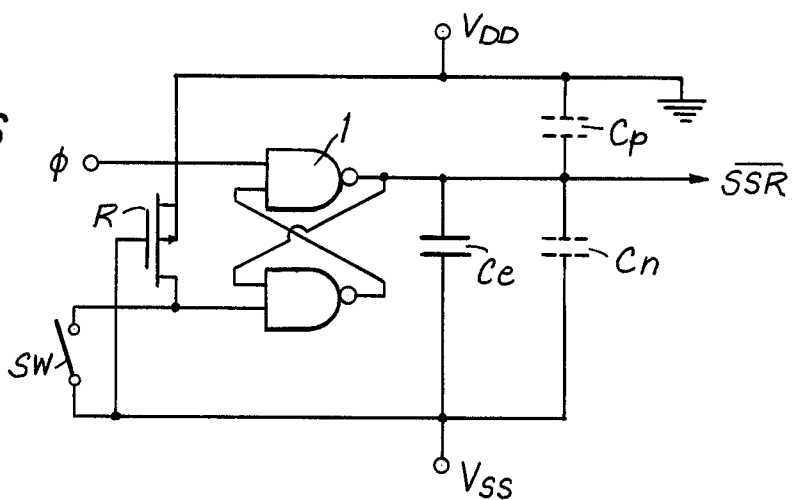
FIG. 6 is a circuit diagram of a semiconductor integrated power-on reset circuit constructed in accordance with still a further preferred embodiment of the instant invention.

Reference is now made to FIG. 6, wherein a semiconductor integrated POR circuit formed of C-MOS transistors is depicted, like reference numerals being utilized to denote like elements discussed above. It is noted that the two NAND GATES coupled to define a standard set-reset flip-flop logic connection are completely formed of C-MOS transistors (not shown), which transistors are readily integrated into the same circuit chip substrate as the circuitry forming the digital circuitry to be reset thereby. The output terminal $\overline{SSR}$ is coupled to supply voltage $V_{SS}$ through the parasitic N-channel capacitance and is coupled to the reference voltage $V_{DD}$ through the P-channel capacitance $C_p$. Accordingly, the set input applied to the set-reset flip-flop circuit 1 is the change in voltage level of the supply voltage $V_{SS}$ and the reset input applied to the set-reset flip-flop circuit 1 is the first oscillating signal $\phi$ produced by an oscillator circuit.

Figure 7:
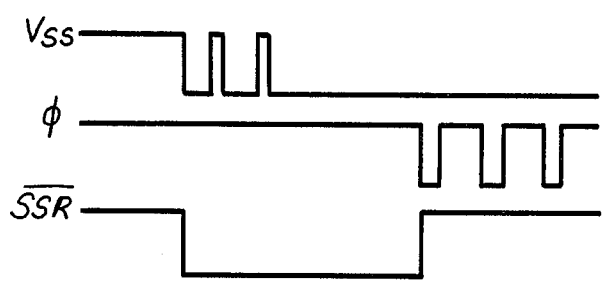
FIG. 7 is a wave diagram illustrating the operation of the power-on reset circuit depicted in FIG. 6.

As is illustrated in FIG. 7, when the power-on signal is applied, the leading edge thereof produces a change in level of the output signal SSR which thereafter remains unaffected by the chatter signals produced by the power-on signal. Accordingly, the set-reset flip-flop circuit 1 holds the change in state until the first leading edge of the oscillating signal is applied to the set-reset flip-flop, at which time the output signal SSR is produced at the output of the set-reset flip-flop to thereby set the digital circuitry to a predetermined binary state. Thus, the inherent delay in energizing the oscillator circuit to a sufficient operating voltage to start same oscillating is utilized in the circuit depicted in FIG. 6 in order to generate the reset pulse after each of the circuit elements is fully energized.

It is noted however that the signal $\phi$ can be produced by a multiple input OR GATE or the like and thereby cause the pulse $\phi$ to have a leading edge at a time earlier than the termination of the chatter and noise signals produced by the power-on signal $V_{SS}$. Nevertheless, the parasitic capacitance on the signal line when that signal $\phi$ is initially applied to the set-reset flip-flop is sufficiently large so that when an early oscillation occurs, the pulses $\phi$ are absorbed by the parasitic capacitance. Specifically, the transient (chatter) or poorly formed pulses will be absorbed by the parasitic capactance $C_n$ since the circuit depicted in FIG. 6 does not operate until the capacitance $C_e + C_n$ is placed in a fully charged state. Thus, in an ordinary semiconductor integrated circuit, the parasitic capacitance is discharged by the leakage current so that the above-mentioned state does not occur. In order to avoid this occurrence, a high resistance is inserted in parallel with the parasitic capacitance $C_e + C_n$ in order to discharge the leakage current caused thereby.

It is noted that the MOS resistance used in this circuit can be other types of resistances and additionally that the $C_p$ channel side can be utilized in order to take advantage of the parasitic capacitance in accordance with the instant invention.

Thus, the instant invention is particularly characterized by the use of the parasitic capacitance caused by the wiring connections in an integrated circuit chip to obtain a simple semiconductor integrated POR circuit having high reliability. Moreover, by increasing the density of the circuit elements on the circuit chip, a corresponding increase in parasitic capacity is utilized to facilitate the operation of the POR circuit, a condition which is particularly advantageous in small-sized low-power digital instrumentation. Moreover, as is illustrated in the embodiments depicted in FIGS. 3 and 5, by adding an additional capacitor $C_a$ in parallel with the manually operated switch SW, a manually operated reset switch can be provided for each of the circuits to permit same to be manually reset, Thus, the density on the integrated circuit chip can be clearly improved and additionally, the capacitor $C_a$ is needed in order to render more gradual the change in potential obtained by the POR circuit when manual resetting of the digital circuitry is affected by the manually operated switch SW.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In a semiconductor integrated circuit chip having digital circuit means formed of MOS transistors constructed and arranged on a substrate to define a predetermined parasitic capacitance, the improvement comprising a voltage supply means including a reference terminal and a supply voltage terminal for selectively applying to said digital circuit means a supply voltage for operating said digital circuit means at said supply voltage, and reset circuit means disposed intermediate said supply voltage terminal and said reference terminal, said reset circuit means including at least first and second complementary coupled opposite polarity MOS transistor means coupled to define an output terminal having said predetermined parasitic capacitance thereat, said first transistor means being further coupled to said reference terminal and said second transistor means being further coupled to said supply voltage terminal so that said first transistor means is turned ON and defines a predetermined resistance between said reference terminal and said output terminal when said supply voltage is initially applied to said reset circuit means and defines in series with at least said parasitic capacitance between said output terminal and said supply voltage terminal an RC constant so that a reset signal is applied at said output terminal to said digital circuit means a predetermined interval of time after said supply voltage is initially applied to said reset circuit means and digital circuit means.

2. A semiconductor integrated circuit chip as claimed in claim 1, wherein said pair of MOS transistor means are complementary coupled to define commonly coupled gate electrodes and commonly coupled drain electrodes so that said commonly coupled gate electrodes define an input terminal of said reset circuit means and said commonly coupled drain electrodes define said output terminal of said reset circuit means.

3. A semiconductor integrated circuit chip as claimed in claim 2, wherein said first transistor means includes a resistance means, said first transistor means including a source electrode coupled to said reference potential through said first resistance means, and the said second transistor means including a source electrode coupled to said voltage supply terminal.

4. A semiconductor integrated circuit chip as claimed in claim 3, wherein said input terminal of said reset means is coupled through a second resistance means to said voltage supply means.

5. A semiconductor integrated circuit chip as claimed in claim 3, wherein said second MOS transistor means of said reset circuit means is an N-channel transistor.

6. A semiconductor integrated circuit chip as claimed in claim 5, wherein said digital circuit means and reset circuit means are constructed and arranged on said substrate so that said first and second complementary coupled pair of transistor means includes an N-channel transistor and a P-channel transistor, the parasitic capacitance at the drain electrode of said N-channel transistor being substantially greater than said parasitic capacitance at the drain electrode of said P-channel transistor.

7. A semiconductor integrated circuit chip as claimed in claim 6 including further capacitance means in parallel with said parasitic capacitance across said N-channel transistor.

8. A semiconductor integrated circuit chip as claimed in claim 7, wherein said further capacitance includes the parasitic capacitance produced by cross-over in said digital circuit means.

9. A semiconductor integrated circuit chip as claimed in claim 3, and including a P-channel transistor resistance means and an N-channel resistance means respectively coupled intermediate the first source electrodes of said first transistor means and said reference potential and the source electrode of said second transistor means and said voltage supply terminal.

10. A semiconductor integrated circuit chip as claimed in claim 3, and including a manually actuated switch means coupled intermediate to said input terminal of said reset means and said reference terminal for manually resetting said digital circuit means in response to the manual actuation of said switching means.

11. A semiconductor integrated circuit chip as claimed in claim 10, and including capacitor means coupled in parallel with said manually actuated switch means.

12. In a semiconductor integrated circuit chip having digital circuit means formed of MOS transistors constructed and arranged on a substrate to define a predetermined parasitic capacitance, the improvement comprising a voltage supply means for selectively applying to said digital circuit means a supply voltage for operating said digital circuit means at said supply voltage, said digital circuit means being adapted to produce a clock signal at a predetermined interval of time after said supply voltage is initially applied to said digital circuit means, and reset circuit means including a first input terminal for receiving said supply voltage and a second input terminal for receiving said clock signal produced by said digital circuit means, said reset circuit means including an output terminal having a predetermined parasitic capacitance between said output terminal and said voltage supply means, said reset circuit means in response to said supply voltage means being initially applied thereto being adapted to produce at said output terminal a temporary state signal, said reset circuit means being further adapted in response to said clock signal being applied to said second terminal at said predetermined interval of time determined at least in part by said parasitic capacitance between said output terminal and said voltage supply means to apply a change of state reset signal to said digital circuit means.

13. A semiconductor integrated circuit chip as claimed in claim 12, wherein said reset circuit means is a set-reset flip-flop means including a first input coupled to said signal supply voltage means for setting said flip-flop means when said supply voltage is initially applied to said set-reset means, said set-reset flip-flop means including a second input adapted to receive said oscillatory signal and be reset thereby.

14. A semiconductor integrated circuit chip as claimed in claim 13, and including manually actuatable switch means coupled intermediate said first set input and said voltage supply means for selectively applying a reset pulse to said digital circuit means in response to the manual actuation of said switch means.

* * * * *